United States Patent [19]

Lee et al.

[11] Patent Number: 4,971,512

[45] Date of Patent: Nov. 20, 1990

[54] TRANSPORT DEVICE FOR WAFERS OF VARIABLE DIAMETER

[75] Inventors: Sang S. Lee; Bong K. Kang; Seung K. Park; Hyoung J. Yoo, all of Chungnam, Rep. of Korea

[73] Assignees: Korea Electronics and Telecommunications Research Institute; Korea Telecommunication Authority, both of Seoul, Rep. of Korea

[21] Appl. No.: 285,596

[22] Filed: Dec. 16, 1988

[30] Foreign Application Priority Data

Dec. 18, 1987 [KR] Rep. of Korea ............... 14516/1987

[51] Int. Cl.[5] ................................. B65G 7/00
[52] U.S. Cl. .............................. 414/744.8; 294/103.1; 901/39; 414/744.6; 414/751; 414/225
[58] Field of Search ............ 414/225, 416, 741, 744.6, 414/744.8, 751, 752; 901/30, 31, 39; 294/103.1, 34

[56] References Cited

U.S. PATENT DOCUMENTS

| | | |
|---|---|---|
| 4,410,209 | 10/1983 | Trapani .................................. 294/34 |
| 4,453,757 | 6/1984 | Soraoka ............................. 294/34 X |
| 4,639,028 | 1/1987 | Olson .................................... 294/34 |
| 4,730,976 | 3/1988 | Davis et al. ................... 414/744.6 X |
| 4,789,294 | 12/1988 | Sato et al. ......................... 414/225 X |
| 4,808,059 | 2/1989 | Eddy .............................. 414/225 X |
| 4,813,732 | 3/1989 | Klem .................................. 901/30 X |
| 4,820,930 | 4/1989 | Tsutsui et al. ................... 414/416 X |

Primary Examiner—Robert J. Spar
Assistant Examiner—James T. Eller, Jr.
Attorney, Agent, or Firm—Evenson, Wands, Edwards, Lenahan & McKeown

[57] ABSTRACT

A transport device for handling wafers of different diameters utilized in the manufacture of semiconductors. A robotic arm is equipped with a fork-shaped wafer support board and an arm slide movable relative to the robotic arm. The fork-shaped end of the support board is provided with fixed pins on one side to support wafers and on another side with plate springs carrying pins which can be depressed by the weight of a wafer to accommodate larger size wafers. The device permits wafers of different diameters accurately and safely to be transferred from its center to a predetermined station without the need for changing the wafer support board or correction of the robotic arm.

22 Claims, 6 Drawing Sheets

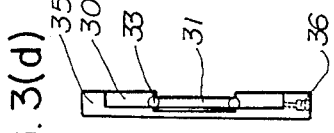
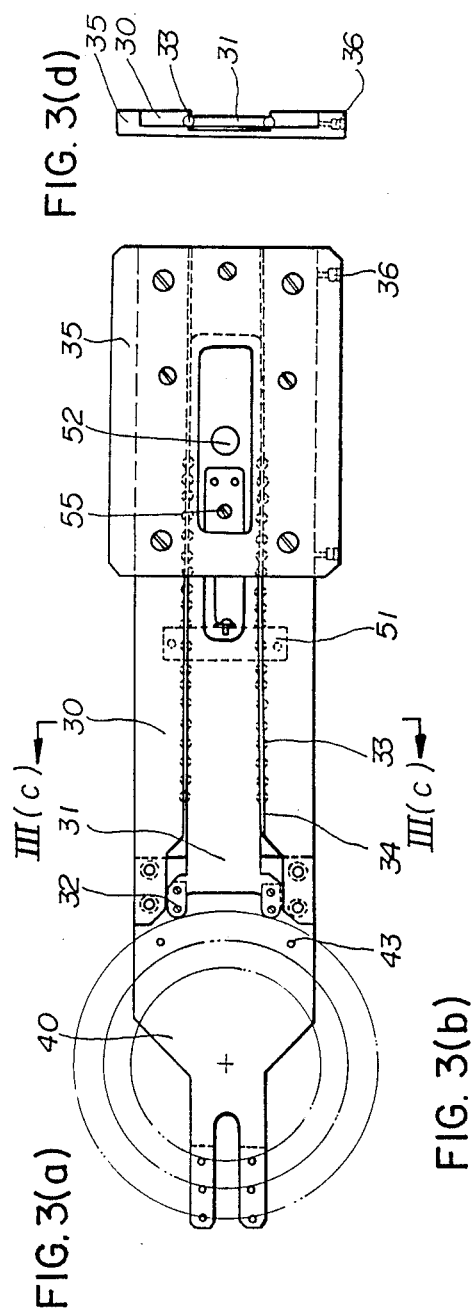
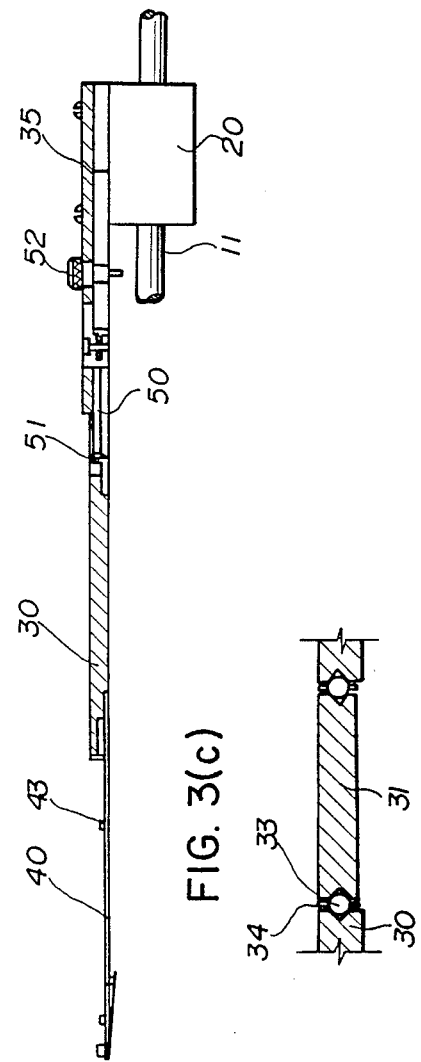

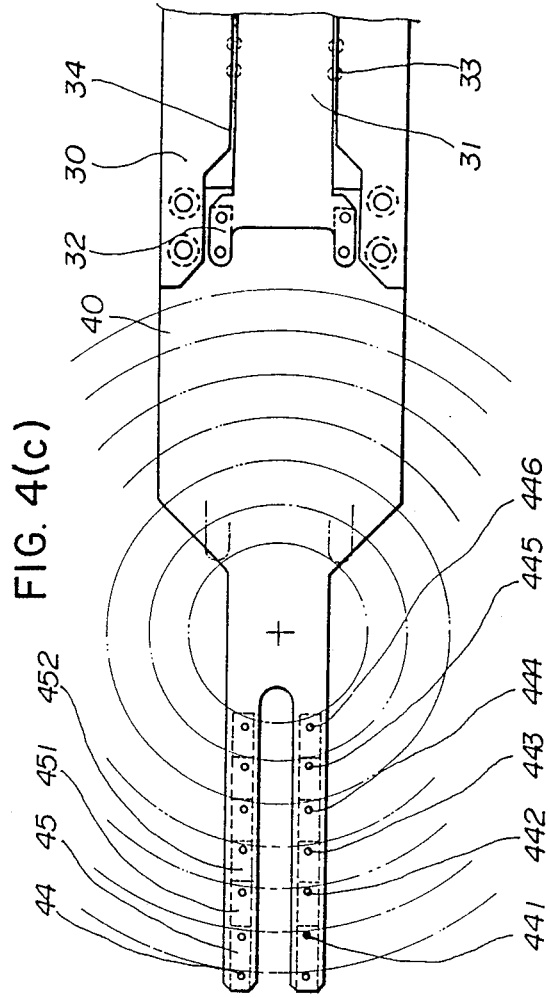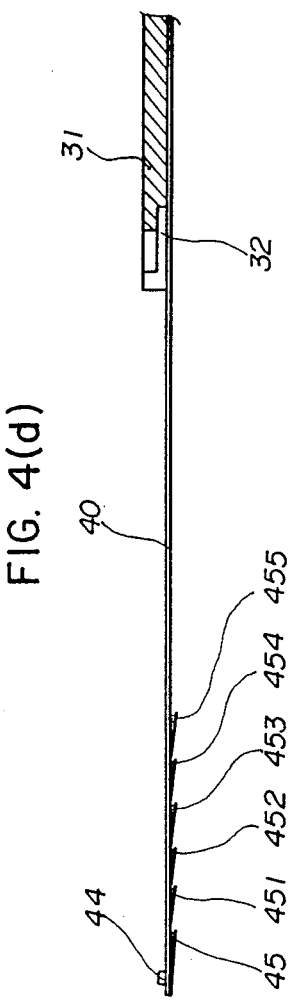

TRANSPORT DEVICE FOR WAFERS OF VARIABLE DIAMETER

BACKGROUND OF THE INVENTION

This invention relates a transport device for wafers of varying diameters in connection with a semiconductor manufacturing apparatus. More particularly, the present invention relates to a transport device which can transport a wafer to the center of a reactor and also transport the wafer to a vacuum load lock system from the reactor without the need to change a wafer holder for wafers with diameters between 2 inches to 8 inches.

In general, various semiconductor wafers with diameters of 2 to 6 inches are used in semiconductor manufacture. Poisonous gas, such as silane ($SiH_4$) and ammonia ($NH_3$), is frequently used in such manufacture. At the same time, extremely small pattern formation is required in order to increase the density of semiconductor elements on the wafer. As a result, contamination on the wafer from small particles must be prevented as much as possible.

Accordingly, a vacuum load lock system is required in a highly efficient semiconductor manufacturing apparatus for contamination prevention caused by small particles and for prevention of leakage of poisonous gas. The wafer transport device is also required in this vacuum load lock system in order to transport the wafer to the reactor which is formed with a cassette or a wafer supply device.

Among the wafer devices which are presently used, a wafer transport device which utilizes a robotic arm is widely viewed as the most reliable system for operation in the inner part of the vacuum system and the one which introduces the fewest contamination particles. However, in such a device which takes advantage of the features of a conventional robotic arm, the diameter of the wafer used is fixed, and thus this device is of limited value. A robotic arm having variable diameter capacity can transport wafers to the center of the reactor and to the center of the vacuum load lock system but only by changing the wafer holder when the wafer diameter changes. This causes a decline in production efficiency and unduly complicates the manufacturing process.

SUMMARY OF THE INVENTION

It is an object of the present invention to overcome the problems and disadvantages encountered in prior art wafer transport devices.

The foregoing problems have been solved in accordance with the present invention by providing a mechanism which transports wafers of different diameter centered in a holder to the center of the reactor and which includes a plurality of wafer fixing pins and a wafer equilibrium pin, at the forward end of a robotic arm which transports the wafer from the reactor to the vacuum load lock system. The mechanism further includes a constant force spring arm slide at the back bottom part of the robotic arm, and transports a centered wafer from one place to a predetermined second place correctly and safely.

BRIEF DESCRIPTION OF THE DRAWINGS

These and further features, objects and advantages of the present invention will become more apparent from the following detailed description when taken in conjunction with the accompanying drawings wherein:

FIG. 3(a) is a plan view of the robotic arm of the wafer transport device shown in FIG. 1;

FIG. 3(b) is an elevation view of the robotic arm shown in FIG. 3(a);

FIG. 3(c) is a partial sectional view of a robotic arm ball retainer for the robotic arm taken along line II—II of FIG. 3(a);

FIG. 3(d) is an end rotated view of the robotic arm shown in FIG. 3(a);

FIG. 4(c) is a plan view of the board similar to FIG. 4(a) but equipped with wafer fixed pins and a plate spring for transporting seven kinds of wafers;

FIG. 4(d) is an elevation view of the board shown in FIG. 4(c);

DETAILED DESCRIPTION OF A PREFERRED EMBODIMENT

Figure 1:
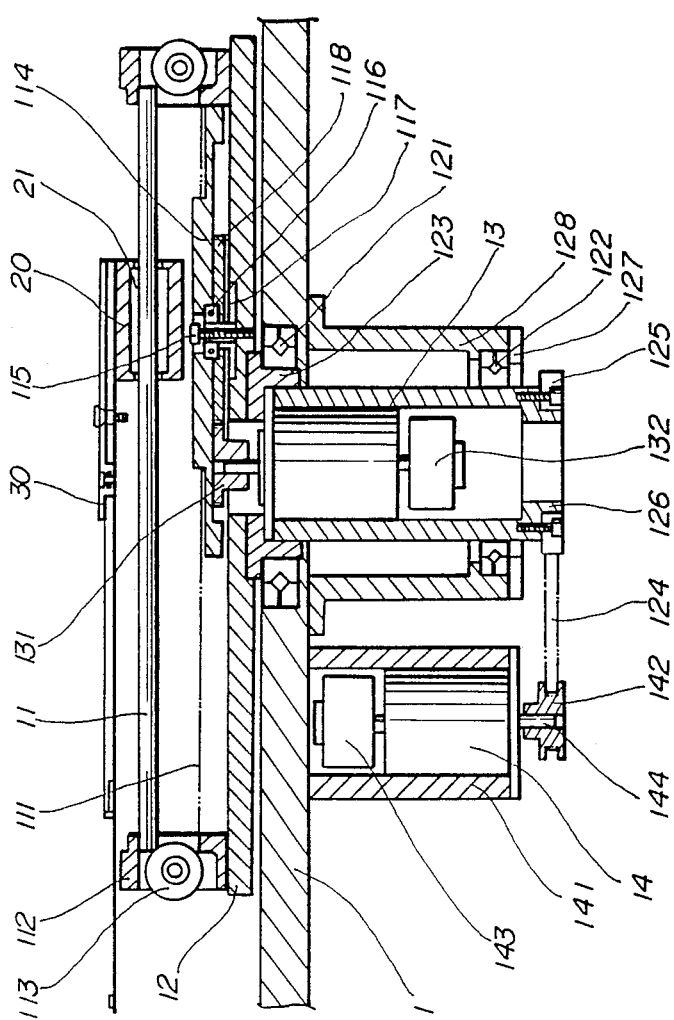
FIG. 1 is a sectional elevation view of a transport device for different diameter wafers in accordance with the present invention.

Referring now to the drawings, there is shown a wafer transport device which transports centered wafers of between 2 to 8 inch diameters to a predetermined center of a semiconductor manufacturing reactor or to the center of the vacuum load lock system without the need for changing the robotic arm.

In particular, FIG. 1 is a vertical sectional view of the wafer transport embodying the present invention. A robotic arm 30 is movable arranged at the top of a wafer transport device board 1. A turntable 12 is provided at the lower part of the arm 30 adjacent the board 1 for effecting selected rotational motion of the robotic arm 30 A rotatable shaft 126 fixed to the turntable 12 is arranged in an aperture of the board 1 by way of bearings 121, 122, upper and lower bearing covers 123,127 and a bearing housing 128. A stepping motor 14 is fixed at the board 1 within a housing 141. The rotational motion of the stepping motor 14 is transmitted by a timing belt 124 from a timing pulley 142 fixed to a motor shaft 144 to a timing pulley 125 fixed on the shaft 126 of the turntable 12.

Figure 2A:
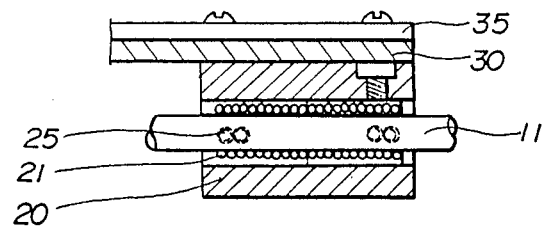
FIG. 2(a) is a partial sectional view of the robotic arm support board at the guide shafts of the wafer transport device shown in FIG. 1.
Figure 2B:
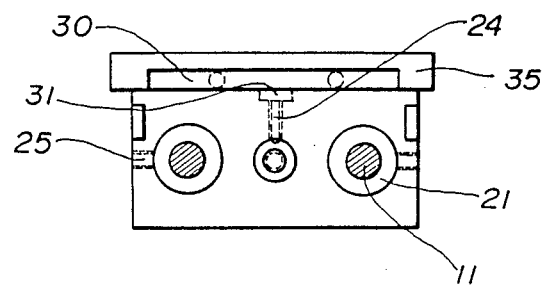
FIG. 2(b) is a side view of the robotic arm support board and guide shafts shown in FIG. 2(a)

The arm 30 is fixed on a support bracket 20 so as to be driven linearly by a robotic arm stepping motor 13 which is provided within of turntable shaft 126. The rotational motion of the stepping motor 13 is transmitted through a pinion gear 131, a gear 118 fixed to a pulley 114 on a pulley shaft 115 fixed on the turntable 12. The rotational motion of the pulley 114 is converted into a linear motion of the support bracket 20 by two rollers 113 rotatably mounted in a roller bracket 112 situated at both ends of the turntable 12. A stainless steel line 111 is connected to both sides of the bracket 20 as shown in greater detail in FIG. 2(c). The support bracket 20 drives along two guide shafts 11 fixed at the roller bracket 112, and a linear motion bearing 21 is provided on the support bracket 20 adjacent the shafts 11 as shown in FIG. 2(a) in order to facilitate the linear motion.

Figure 2C:
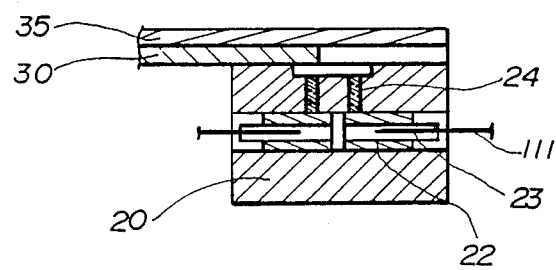
FIG. 2(c) is a sectional view of the stainless steel line terminal at the robotic arm support board taken along line I—I of FIG. 2(b)

The stainless steel line 111 is fixed at the support bracket 20 with a line terminal 22 and line fixing screws 24 as shown in FIG. 2(c). A line tension control screw 23 is connected to the line terminal 22, and the tension of the stainless steel line 111 can be controlled by rotation of the line tension control screw 23.

As the robotic arm 30 begins to retract, arm slide 31 shown in FIG. 3(a) moves forward relative to the robotic arm 30 by virtue of the slide balls 33. After a wafer (shown in phantom lines) is held tightly by one set of the fixed pins 41,411,412 of a forked-shaped wafer support board 40 fixed to the arm 30, the arm slide 31 retracts along with the robotic arm 30. The arm slide balls 33 are held between the robotic arm 30 and the arm slide 31 as shown in FIG. 3(c).

An impact absorption plate 32 is also provided between the arm slide 31 and the robotic arm 30 to absorb the impact from the wafer being added to the board 40 upon advance and retraction of the robotic arm 30 and also to smooth the motion of arm slide 31. Vibrating reduction units 132,143 shown in FIG. 1 are provided at the stepping motors 13,14, respectively, so as to reduce vibrations therein.

The robotic arm 30 has a bracket 35 on its top surface at one end thereof to fix the arm 30 relative to the bracket 20. The arm slider 31 helps in transporting the wafer and removing the wafer with the structure shown in FIGS. 3, 4 and 5 show.

Figure 4A:
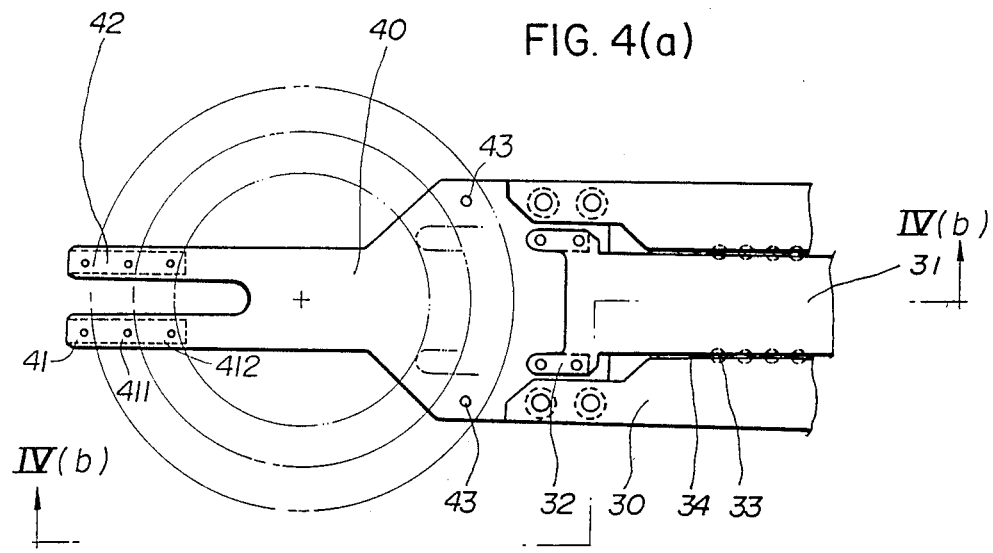
FIG. 4(a) is a partial plan view of the variable wafer support board shown in FIG. 1 showing in detail the wafer fixed pins and a plate spring for transporting three kinds of wafers.
Figure 4B:
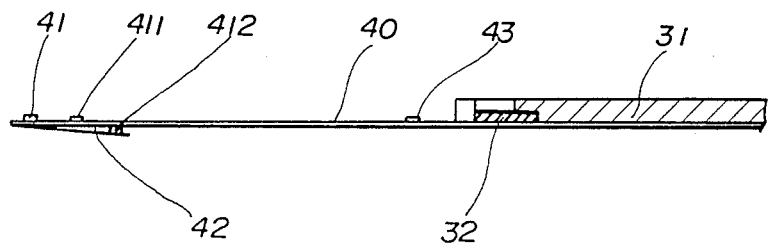
FIG. 4(b) is an elevation view of the board of FIG. 4(a)
Figure 5A:
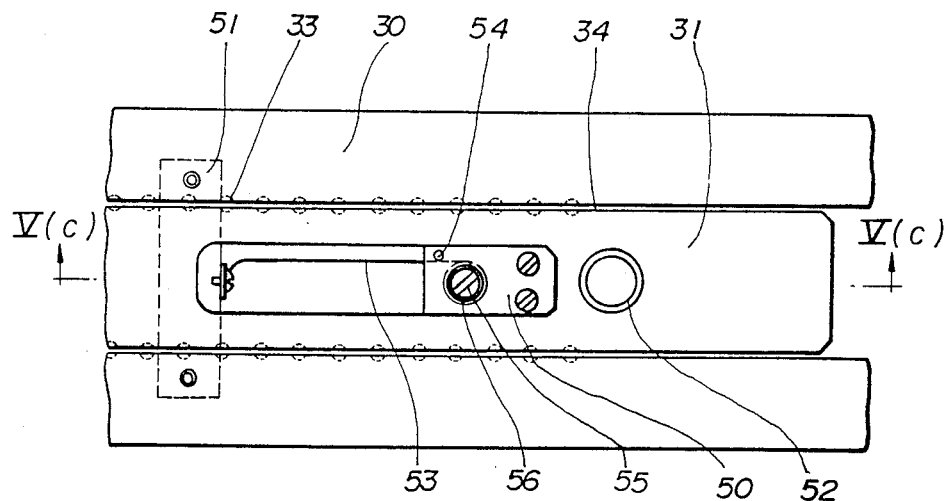
FIG. 5(a) is a partial plan view of the wafer place fixing portion of the device shown in FIG. 1.
Figure 5B:
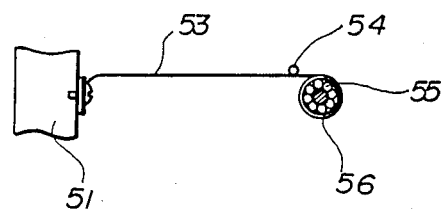
FIG. 5(b) is an isolated plan view of the constant force spring arrangement shown in FIG. 5(a)
Figure 5C:
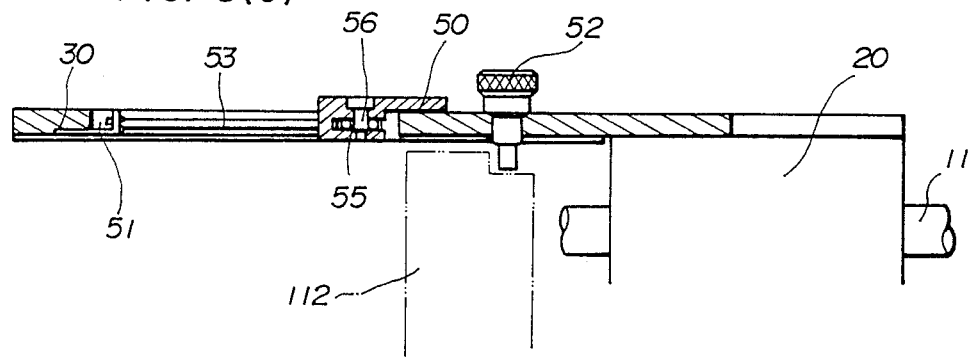
FIG. 5(c) is an elevation view of the board shown in FIG. (a).

The wafer support board 40 shown in FIGS. 4(a)-(d) is constructed such that the centers of wafers of different diameter will be at a fixed place with respect to the robotic arm 30 as shown in FIG. 4(a). FIG. 4(b) illustrates wafer fixed pins 41,411,412 of different heights at the free end of the support board 40 used to transport wafers of three different most widely used diameters, i.e. from 3 inches to 5 inches or from 4 inches to 6 inches. Plate spring 42 is provided at the lower side of the board 40 in order to permit the wafer pin 412 of the smallest diameter to be moved to the lower side of the board when larger wafers are transported. Pins 43 are formed inwardly on the board 40 in order to maintain the largest diameter wafers level.

FIG. 4(c) illustrates wafer pins 44, 441, 442, 443, 444, 445, 446 formed at the free part of the support board 40 used for transporting wafers of seven different diameters, i.e. from 2 inches to 8 inches. Individual plate springs 45, 451, 452, 453, 454, 455 are formed in order to permit the fixed pins 441,442,443,444,445,446 to be pushed out on the lower side of the board. If the distance from the center of the support board 40 to one of the fixed pins is smaller than a radius of the wafer to be transported, each such fixed pin will be depressed to the lower side of the board.

The arm slider 31 is constructed to exert a substantially constant biasing force for a distance of more than 6 inches in order to securely fix the wafers of diameters between 2 inches to 8 inches on the robotic arm 30. To this end, the wafer place fixing portion 50 is provided as shown in FIG. 5 A spring support board 51 is fixed at the robotic arm 30. A constant force spring 53 is fixed at one end to the board 51 and at the other end at the center part of the slider 31 in order to push the wafer with a constant force. The spring 53 is rolled up around a bearing 55 on the portion 50 at one side of the slider 31.

The bearing 55 around which the spring 53 is rolled up is fixed at the wafer place fixing portion 50 which is fixed at the arm slider 31 by bearing hinge 56. A spring retainer 54 assures that the spring 53 will wind and unwind properly, and an arm slider stop pin 52 is provided to abut against the bracket 112 to limit forward movement of the arm 30. An impulse absorbing board 32 (FIG. 3) is provided at the forward end of the arm slider 31.

The operation of the transfer device will now be described. As power is provided to actuate the device, the stepping motor 14 rotates the turntable 12, from the timing belt pulley 142 and the timing belt 124 on the motor shaft 144, from the timing pulley 125 fixed at the turntable shaft 126. As the robotic arm stepping motor 13 equipped at the inner part of the turntable shaft 126 is actuated, the rotational motion of the stepping motor 13 drives the gear 118 fixed at the pulley 114 through the pinion gear 131.

The rotation of the pulley 114 causes the stainless steel line 111 which is operatively associated with the pulley 114 and is connected at both ends to the support bracket 20 attached to the robotic arm 30 to translate through the rollers 113 which are rotatable in the roller brackets 112 located at both ends on the turntable 12. The rotational motion of the pulley 114 is thus converted into the linear motion of the support bracket 20. As the support bracket 20 moves linearly along the guide shafts 111 fixed at the roller bracket 112, the robotic arm 30, which is provided with a desired number of the wafer fixed pin 44, 441 . . . 446, the plate spring 45, 451 . . . 455 and the wafer equilibrium pins 43 also moves linearly. When the robotic arm 30 has completed its movement to the wafer loading position, the wafer is moved perpendicular to the arm movement direction so as to be properly located upon the robotic arm and transferred to another station.

If a large-diameter wafer is put on the wafer equilibrium pins 43, the pins 411,412, in FIG. 4(a) or 441 . . . 446 in FIG. 4(c) are pressed down by the weight of the wafer, and only the fixed pins 41 or 44 which are outside of the wafer diameter, remain jutted out so that the center of wafer support board 40 and the center of the wafer coincide.

Subsequently, the robotic arm 30 is moved linearly by the stepping motor 13, and as the arm slider 31 and stopper 52 reaches the roller bracket 112, the robotic arm 30 continues to move linearly but the arm slide 31 is stopped by the stopper 52, at which time the wafer is removed. After the wafer is again put on the wafer support board 40, the robotic arm 30 retracts in order to transfer the wafer to another station.

While we have shown and described a presently preferred embodiment in accordance with the present invention, it is to be clearly understood that the same is susceptible of numerous changes without departing from the scope of the present invention. Therefore, we do not intend to be limited to the details shown and described herein but intend to cover all such changes and modifications as are encompassed within the scope of the appended claims.

We claim:

1. A wafer transport device, comprising
   a turntable;
   a robotic arm operatively connected with said turntable and arranged for linear movement with respect thereto; and
   means arranged at a free end of said robotic arm for holding wafers of different diameters without interchanging parts of said robotic arm, said means for holding comprising wafer pins affixed to biasing means in such manner that certain of said pins can be moved out of the way against a force provided by the biasing means when a wafer of a particular diameter is placed thereover.

2. A wafer transport device according to claim 1, wherein said biasing means is comprised of a plate spring.

3. A wafer transport device according to claim 1, wherein said robotic arm includes an arm slide movable relative thereto and constant force biasing means for maintaining a substantially constant force on said arm slide as it moves relative to said robotic arm for securely fixing thereon at least one wafer being carried thereby.

4. A wafer transport device according to claim 3, wherein an impact absorbing plate is arranged between said robotic arm and said arm slide to cushion impacts caused by contact therebetween.

5. A wafer transport device according to claim 1, wherein said biasing means is comprised of a plate spring.

6. A wafer transport device according to claim 3, wherein said constant force biasing means is arranged at an end of said arm slide remote from an end of said arm slide proximate to the free end of said robotic arm.

7. A wafer transport device according to claim 6, wherein said wafer pins are arranged on said robotic arm such that centers of different diameter wafers arranged on said robotic arm will be located at the same point on said robotic arm.

8. A wafer transport device according to claim 6, wherein an impact absorbing plate is provided at the end of said arm slide proximate the free end of said robotic arm to prevent undesired impact forces on carried wafers upon advance and retraction of said robotic arm.

9. A wafer transport device according to claim 8, wherein said wafer pins are arranged on said robotic arm such that centers of different diameter wafers arranged on said robotic arm will be located at the same point on said robotic arm.

10. A wafer transport device according to claim 3, wherein balls and a ball retainer are provided between said arm slide and said robotic arm for smooth linear relative motion therebetween.

11. A wafer transport device according to claim 3, wherein a stopper pin is provided at an end of said arm slide remote from an end of said arm slide proximate the free end of said robotic arm, said stopper pin arranged to abut against a portion of the device to stop said arm slide and free the wafers linearly moved by said robotic arm at a predetermined station.

12. A wafer, transport device according to claim 11, wherein balls and a ball retainer are provided between said arm slide and said robotic arm for smooth linear relative motion therebetween.

13. A wafer transport device according to claim 12, wherein an impact absorbing plate is provided at the end of said arm slide proximate the free end of said robotic arm to prevent undesired impact forces on carried wafers upon advance and retraction of said robotic arm.

14. A wafer transport device according to claim 1, wherein said wafer pins are arranged on said robotic arm such that centers of different diameter wafers arranged on said robotic arm will be located at the same point on said robotic arm.

15. A wafer transport device according to claim 1, wherein a first set of fixed wafer pins are arranged at the free end of said robotic arm, a second set of fixed wafer pins are arranged inwardly of the free end of said robotic arm, and said wafer pins affixed to said biasing means are arranged between said first and second sets of fixed wafer pins.

16. A wafer transport device according to claim 15, wherein said robotic arm includes an arm slide movable relative thereto and constant, force biasing means for maintaining a substantially constant force on said arm slide as it moves relative to said robotic arm for securely fixing thereon at least one wafer being carried thereby.

17. A wafer transport device according to claim 16, wherein said wafer pins are arranged on said robotic arm such that centers of different diameter wafers arranged on said robotic arm will be located at the same point on said robotic arm.

18. A wafer transport device according to claim 15, wherein said first set of fixed wafer pins and said wafer pins affixed to said biasing means have spacings sized accordingly to accommodate wafers of different diameters such that the centers of such wafers are located at the same point on said robotic arm.

19. A variable diameter type wafer transport device, comprising:
   a turntable, a guide rail mounted on said turntable, a carrier movable linearly with respect to said guide rail, a robotic arm fixed at the carrier, a wafer support board fixed to a front edge of said robotic arm, wafer pins arranged at a front end of said wafer support board and operatively connected with plate spring means so as to be selectly deflected in accordance with the size of a wafer depending on wafer weight, and an arm slide movable linearly along the body of said robotic arm, with a constant force spring means fixed on the body of said robotic arm and on the arm slide, said arm slide being connected at a back edge of said robotic arm, whereby different diameter wafers can be accommodated and transferred by gripping without interchanging portions of said robotic arm.

20. A wafer transport device according to claim 19, wherein different diameter wafers can be accommodated by movement of certain of said wafer pins at specific locations to a different height from the other of said wafer pins at other locations.

21. A wafer transport device according to claim 20, wherein different diameter wafers abut against wafer pins affixed at said wafer support board.

22. A wafer transport device according to claim 19, wherein a spiral spring is set at the back edge of said arm slide, and the different diameter wafers are gripped with substantially constant force.

* * * * *